United States Patent
Goldstein et al.

[11] Patent Number: 6,040,246
[45] Date of Patent: Mar. 21, 2000

[54] METHOD OF MANUFACTURING AN INTEGRATED OPTICAL COMPONENT COMPRISING A THICK WAVEGUIDE COUPLED TO A THIN WAVEGUIDE

[75] Inventors: Léon Goldstein, Chaville; Denis Leclerc, Igny; Béatrice Dagens, Paris, all of France

[73] Assignee: Alcatel, Paris, France

[21] Appl. No.: 09/148,480

[22] Filed: Sep. 8, 1998

[30]   Foreign Application Priority Data

Sep. 11, 1997 [FR] France .................................. 97 11298

[51] Int. Cl.[7] ......................... H01L 21/02; H01L 21/20; H01L 21/3065; G02B 6/13; G02B 6/136
[52] U.S. Cl. ..................... 438/706; 385/50; 385/129; 385/130
[58] Field of Search .................. 385/130, 131, 385/50, 129; 438/706

[56]   References Cited

U.S. PATENT DOCUMENTS

| | | | |
|---|---|---|---|
| 3,948,583 | 4/1976 | Tien | 385/14 |
| 4,820,655 | 4/1989 | Noda et al. | 385/27 |
| 5,332,690 | 7/1994 | Cho et al. | 438/31 |
| 5,379,359 | 1/1995 | Gupta | 385/49 |
| 5,472,907 | 12/1995 | Binsma et al. | 438/31 |
| 5,568,579 | 10/1996 | Okaniwa | 385/43 |

FOREIGN PATENT DOCUMENTS 0 454 902 A2   11/1991   European Pat. Off. ................ 1/1

OTHER PUBLICATIONS

Patent Abstracts of Japan, vol. 097, No. 010, Oct. 31, 1997 corresponding to JP 09 152528 A (Sharp Corp) dated Jun. 10, 1997.

Patent Abstracts of Japan, vol. 095, No. 005, Jun. 30, 1995, corresponding to JP 07 043552 A (Hitachi Cable Ltd) Feb. 14, 1995.

Patent Abstracts of Japan, vol. 097, No. 006, Jun. 30, 1997, corresponding to JP 09 036487 A (Fujitsu Ltd), Feb. 7, 1997.

Patent Abstracts of Japan, vol. 006, No. 229 (P–155) Nov. 16, 1982 corresponding to JP 57 132105 A (Nippon Denki KK) Aug. 16, 1982.

*Primary Examiner*—Benjamin Utech
*Assistant Examiner*—Lynette T. Umez-Eronini
*Attorney, Agent, or Firm*—Sughrue, Mion, Zinn, Macpeak & Seas, PLLC

[57]   ABSTRACT

To form an integrated optical component comprising a thick waveguide coupled to a thin waveguide, the method consists in:

depositing a first guiding layer of said thick waveguide on a substrate;

locally etching said first guiding layer over a portion allocated both to a coupling interface and to the thin waveguide;

depositing a second guiding layer on the first guiding layer and on the locally etched portion so as to form said thick waveguide in a manner such that it has a maximum thickness in a first zone, a graded-thickness section in a second zone, and a reduced-thickness section in a third zone;

locally etching the second guiding layer over a portion of the third zone, said portion being allocated to the thin waveguide; and depositing a third guiding layer in said portion of said third zone so as to form said thin waveguide.

6 Claims, 4 Drawing Sheets

METHOD OF MANUFACTURING AN INTEGRATED OPTICAL COMPONENT COMPRISING A THICK WAVEGUIDE COUPLED TO A THIN WAVEGUIDE

The present invention relates to a method of manufacturing an integrated optical component comprising waveguides having different structures, and in particular different thicknesses. The method makes it possible to minimize coupling losses at the interface between the two types of waveguide and to provide mode matching.

BACKGROUND OF THE INVENTION

Integrated optical components are designed to encompass in particular passive waveguides and active waveguides. In such a component, an active waveguide and a passive waveguide are integrated on a substrate using an end-to-end coupling or "butt coupling" method.

The butt coupling method is in common use for coupling a passive waveguide to an active waveguide. The diagrams in FIGS. 1A to 1C show longitudinal-section views of an integrated optical component during the various steps of the butt coupling method.

That method consists initially in growing a first layer 2 formed of a quaternary material on a substrate 1 to act as a passive waveguide, and in burying it in a second layer 3 formed of InP.

Local etching 4 of the two layers 2 and 3 is then performed using a conventional etching method in a zone reserved for integrating another waveguide that is of the active type.

By resuming epitaxial growth, it is possible to form the active waveguide. For that purpose, a layer 5 constituting the active waveguide and formed, for example, of a quaternary material is deposited on the substrate 1, in the locally-etched zone 4, and it is then buried in a cladding layer 6 formed, for example, of InP. The structure of the active waveguide 5 is different from the structure of the passive waveguide 2. The coupling interface 7 between the two types of waveguide is referred to as a "butt joint".

That manufacturing method is currently well mastered when the interface is shallow, i.e. when the thicknesses of the two waveguides are of the same order of magnitude, and, in any event, when the thickness of the thicker waveguide does not exceed 1 $\mu$m.

However, when the interface is deep, i.e. when the local etching preceding resumption of epitaxial growth is performed over a thickness greater than or equal to 1 $\mu$m, difficulties occur, and that manufacturing method becomes difficult to master. For example, such deep-interface structures are formed for integrating a polarization-insensitive waveguide and a semiconductor optical amplifier in a wavelength converter of the Mach-Zehnder type or of the Michelson type.

In an optical component having a deep interface between the passive waveguide and the active waveguide, and manufactured using prior art methods, the propagation modes have the same dimensions in both types of waveguide. Therefore, in theory, the components have no optical losses. That theory is not borne out in practice because large losses appear at the interface 7. Those losses are due to the fact that, after deep etching, epitaxial growth is very difficult to resume without degrading the crystal quality of the material to be deposited. When the crystal quality of the material is affected, light propagation losses appear at the interface between the two types of waveguide, which losses are greater than one dB and can reach much higher values (a few tens of dB).

In addition, since epitaxial growth is not resumed under good conditions, it is very difficult to align the passive waveguide and the active waveguide correctly, the two waveguides having very different thicknesses.

OBJECTS AND SUMMARY OF THE INVENTION

The present invention makes it possible to mitigate the above-mentioned drawbacks because it proposes a method of manufacturing an integrated optical component, in which method the thick waveguide is formed in two steps, so that the thick waveguide has a thickness gradient so as to make it thinner, and so as to transform the deep interface between the two types of waveguide into a shallow interface.

More particularly, the invention provides a method of manufacturing an integrated optical component comprising a thick waveguide coupled to a thin waveguide via a coupling interface, said method consisting in:

depositing a first guiding layer of said thick waveguide on a substrate;

locally etching said first guiding layer over a portion allocated both to the coupling interface and to the thin waveguide;

depositing a second guiding layer on the first guiding layer and on the locally etched portion so as to form said thick waveguide in a manner such that it has a maximum thickness in a first zone, a graded-thickness section in a second zone, and a reduced-thickness section in a third zone;

locally etching the second guiding layer over a portion of the third zone, said portion being allocated to the thin waveguide; and depositing a third guiding layer in said portion of said third zone so as to form said thin waveguide.

This method includes an additional epitaxy resumption step compared with conventional methods, but it enables the thickness of the waveguide to be reduced gradually so that the transition with the thin waveguide is of the same order of magnitude as a transition having a shallow interface. Thus, the difficulties encountered when resuming epitaxy after deep etching are avoided.

It should be noted that although the coupling interface usually forms an angle of 90° with the optical axis in the plane of said guiding layers, any other value may be chosen for said angle, and in particular 45°.

In an optical component manufactured using the method of the invention, the propagation mode, which is confined in the thick portion of the thick waveguide becomes gradually de-confined as the thickness of said waveguide reduces. Therefore, at the interface between the two types of waveguide, there exist intrinsic optical losses due to the change in thickness. Such losses are related to the fact that the effective refractive index of the thick waveguide in its reduced-thickness portion, i.e. the real refractive index at the interface between the passive waveguide and the active waveguide, is different from the refractive index of the waveguide in its thick portion. However, these optical losses remain significantly smaller than those obtained experimentally with components manufactured using prior art methods because they are less than 1 dB.

BRIEF DESCRIPTION OF THE DRAWINGS

Other features and advantages of the invention appear on reading the following description given by way of nonlimiting example and with reference to the accompanying drawings, in which.

MORE DETAILED DESCRIPTION

In the implementation described below, the thick waveguide is a passive waveguide whereas the thin waveguide is an active waveguide. Naturally, the invention is not limited to this implementation.

A waveguide is defined as being "thick" when its thickness is greater than or equal to 1 μm. A thin waveguide is defined as being a waveguide having a thickness of less than 1 μm.

Figure 1A:
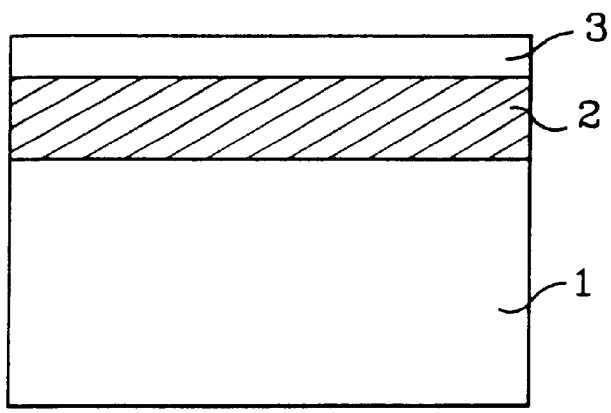
FIGS. 1A to 1C (described above) are views in longitudinal section through an optical component during the steps of a conventional manufacturing method.
Figure 1B:
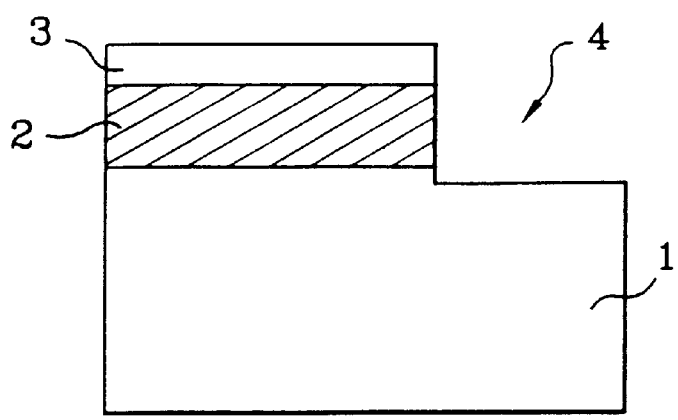
Figure 1C:
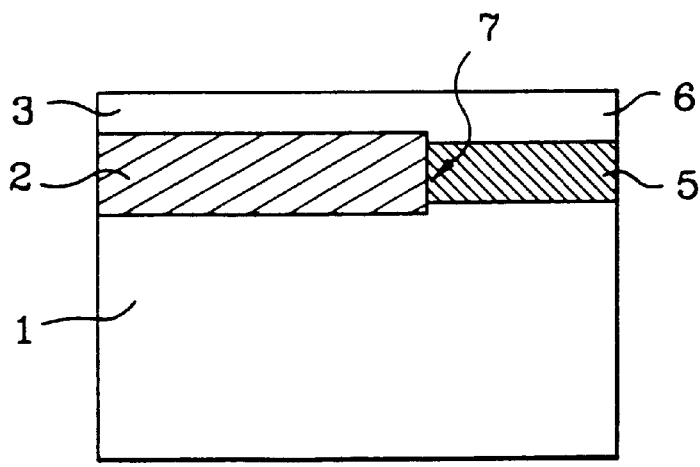
Figure 2A:
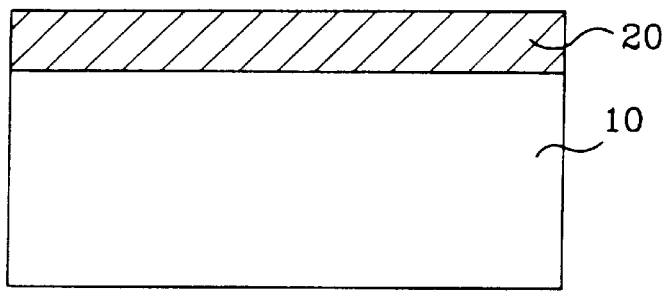
FIGS. 2A to 2F are views of an optical component during the steps of a manufacturing method of the invention.
Figure 2B:
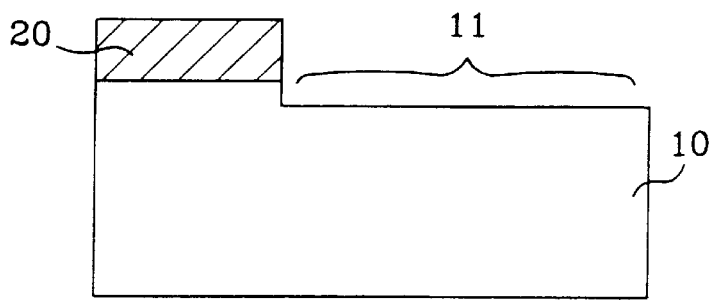
Figure 2C:
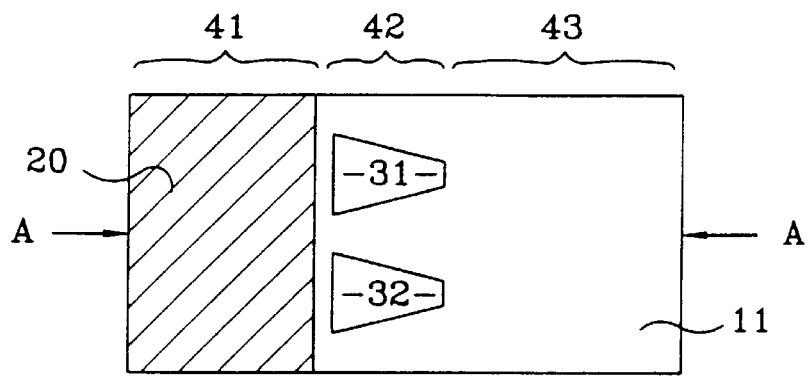

FIGS. 2A, 2B, and 2D to 2F are views in longitudinal section through an optical component during the various steps of the method of the invention, and FIG. 2C is a plan view of the component.

As shown in FIG. 2A, a first step of the method of the invention consists in depositing a first guiding layer 20 on a substrate 10 to form a first portion of the thick, passive waveguide.

In a variant implementation, it is possible, previously, to deposit a buffer layer on the surface of the substrate so as to eliminate any surface defects of the substrate.

The total thickness of the passive waveguide to be formed may lie in the range 1 μm to 3 μm. The thickness of the first guiding layer 20 preferably lies in the range one half of the total thickness of the thick waveguide to two-thirds of said total thickness, i.e. it lies in the range 0.5 μm to 2.1 μm. In the example shown in FIGS. 2A to 2F, the first guiding layer 20 is formed over a thickness 0.5 μm equal to one half of the total thickness of the passive waveguide to be formed. In addition, the first guiding layer 20 may, for example, be formed of a quaternary material, such as a material of the GaInAsP type, for example.

The first guiding layer 20 is then locally etched (FIG. 2B) using a conventional dry etching method. The etching is preformed over a portion 11 reserved both for the thin, active waveguide to be formed and for the coupling interface between the two types of waveguide, i.e. between the thick waveguide and the thin waveguide. In this portion 11, the substrate 10 may also be etched in part, as shown in FIG. 2B.

In a subsequent step, epitaxial growth is resumed in order to deposit a second guiding layer 40 on the first guiding layer 20 and on the etched portion 11. This step, shown in FIGS. 2C and 2D, makes it possible to form the passive waveguide in a manner such that it has a maximum thickness in a first zone 41, a graded-thickness section in a second zone 42, and a reduced-thickness section in a third zone 43. The second guiding layer 40 is formed of the same material as the first guiding layer 20, and it forms the second portion of the thick waveguide.

To shape the graded-thickness section of the passive waveguide, "selective" epitaxy is performed. For this purpose, two dielectric masks 31, 32 are placed on the substrate 10, in the etched portion 11, at the location of the second zone 42, the quaternary material forming the second guiding layer not being deposited on the two masks (FIG. 2C).

The two masks 31, 32 are placed side-by-side, and an increase in growing speed is created so that the second guiding layer 40 grows faster between the masks 31, 32. As a result, in the first and third zones 41 and 43 situated on either side of the masks, the deposition speed is nominal, whereas the deposition speed is significantly accelerated in the second zone 42, and more particularly between the masks 31, 32. The narrower the gap between the masks, the higher the increase in growing speed.

Preferably, the masks 31, 32 are trapezium-shaped, and they are placed side-by-side so that the distance between them is quite short in the vicinity of the first zone 41, corresponding to the section of maximum thickness, and increases gradually going away from the first zone 41 towards the third zone 43 that corresponds to the reduced-thickness section. By means of the special trapezium shape of the masks 31, 32, and by disposing them in this way, it is possible to create a deposition speed gradient for the speed at which the second guiding layer 40 is deposited, and to form a graded-thickness section in the passive waveguide, between the first and third zones 41 and 43 corresponding respectively to the thick section of the waveguide and to the reduced-thickness section thereof.

The trapezium shape of the masks 31, 32 and the manner in which they are disposed are chosen so as to obtain a growing speed gradient for the speed at which the second guiding layer 40 is grown that matches the desired thickness gradient. Thus, the gap between the masks varies, for example, from 15 μm to 100 μm over a length of about 50 μm.

For example, the masks may be made of silica ($SiO_2$), or they may be made of silicon nitride ($Si_3N_4$).

Figure 2D:
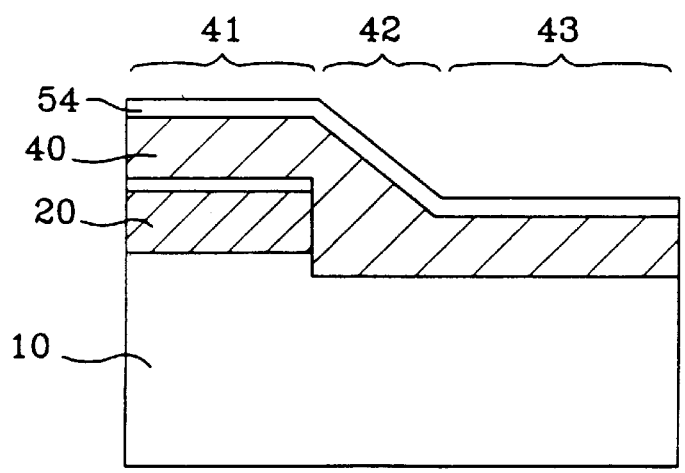

FIG. 2D shows a longitudinal section view on A—A of FIG. 2C. In the example shown in this figure, the second guiding layer 40 is formed over a thickness 0.5 μm equal to one half of the total thickness of the passive waveguide to be formed.

The stack formed by the first guiding layer 20 and by the second guiding layer 40 constitutes the first zone 41 in which the thickness of the waveguide is at its maximum, and, in this example, is equal to 1 μm.

In the second zone 42, the thickness of the waveguide decreases gradually by means of the thickness gradient formed as described above. The thickness gradient is organized to obtain a transition of the propagation mode inside the structure of the passive waveguide that is as adiabatic as possible, i.e. so as to avoid as much as possible any optical losses due to the change in the structure of the waveguide, and in particular due to the change in the thickness of the waveguide.

The thickness of the passive waveguide decreases to a reduced and constant thickness in the third zone 43. The thickness of the waveguide in the third zone 43 is equal to the thickness of the second guiding layer 40 situated above the first guiding layer 20 in the first zone 41 of the waveguide. In order for the coupling interface between the active waveguide and the passive waveguide to correspond to a shallow interface, the thickness of the waveguide in its reduced-thickness portion (zone 43), i.e. the thickness of the second guiding layer 40, must not exceed 1 μm. That is why the thickness of the second guiding layer 40 preferably lies in the range one-third of the total thickness of the waveguide in its thickest portion (zone 41) to one half of said total thickness. The thickness of the second guiding layer thus lies in the range 0.5 μm to 0.9 μm.

The thickness of the thick waveguide is thus progressively reduced so as to provide a propagation mode transition that is as adiabatic as possible between the thick portion (zone 41) of the waveguide and the reduced-thickness portion (zone 43) of the waveguide, the structure of the propagation mode being modified gradually from a confined state (zone 41) to a de-confined state (zone 43).

In addition, the resulting passive waveguide may be buried in a cladding layer 54 formed of InP, for example, as shown in FIG. 2D.

After the selective epitaxy step has been preformed, the masks 31, 32 at the surface of which no material has been deposited are removed by conventional high-frequency treatment.

Figure 2E:
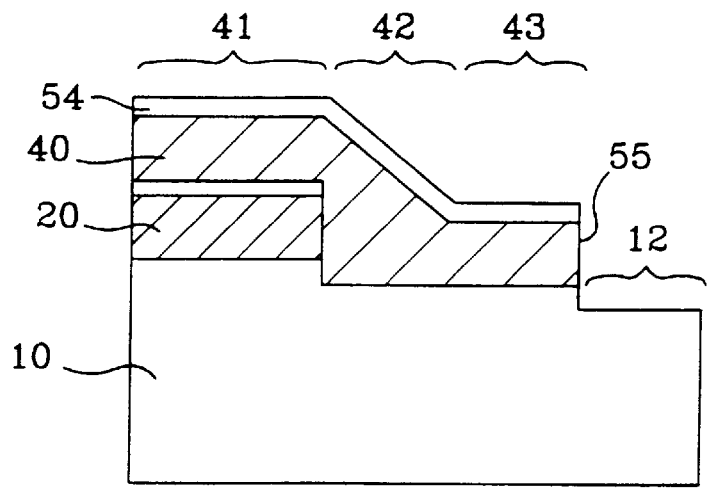
Figure 2F:
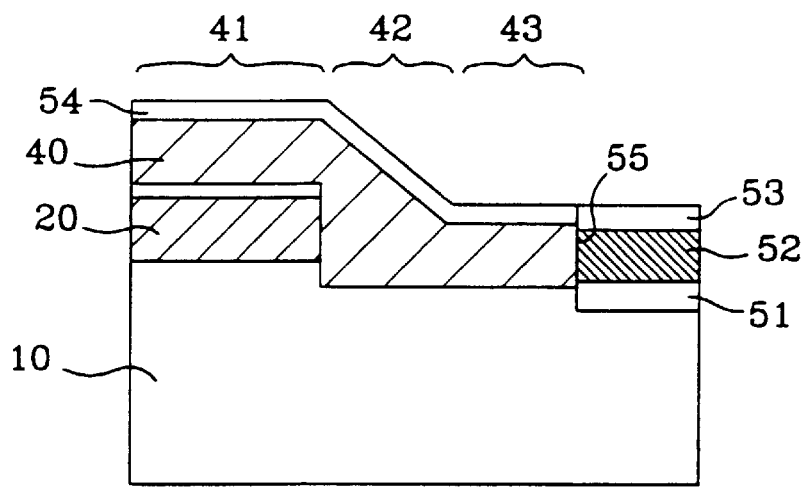

A portion 12 of the second guiding layer 40 of the passive waveguide is then locally etched, in the third zone 43, by means of a conventional dry etching method, so as to cause a surface of the substrate to appear. The portion 12 is reserved for the thin, active waveguide to be coupled to the passive waveguide that has just been formed (FIG. 2E).

Finally, epitaxy is resumed again in a last step (shown in FIG. 2F) so as to form the thin, active waveguide. For this purpose, a first layer 51 formed of InP, for example, is deposited on the substrate, then a third guiding layer 52 forming the thin waveguide is deposited on the layer of InP 51, and is buried in a top cladding layer 53 of InP. For example, the third guiding layer 52 is formed of a quaternary material or of a multiple quantum well structure, or of some other structure. It has a thickness approximately in the range 0.2 μm to 0.5 μm. Said last step is performed conventionally, using the butt coupling method because the coupling face between the two types of waveguide has been transformed into a shallow interface 55.

The bottom layer of InP 51 is optional. It enables the passive waveguide and the active waveguide to be properly aligned with each other. For this purpose, said bottom layer is deposited over a determined thickness which is about 0.15 μm in the implementation shown in FIG. 2F.

By means of the method of the invention, the thickness of the thick waveguide is reduced to transform the deep coupling interface between the passive waveguide and the active waveguide into a shallow interface 55. In this way, the conventional butt coupling method can be used to perform coupling between the two types of waveguide.

Therefore, the optical losses due to the difficulties of resuming epitaxy after deep etching are avoided. The optical losses created at the interface 55 are due to the change in refractive index of the thick waveguide, which change is itself caused by a change in thickness. The effective refractive index of the waveguide, i.e. the real refractive index of the waveguide at the interface 55, differs from the refractive index of the waveguide in its thick portion (zone 41).

Figure 3:
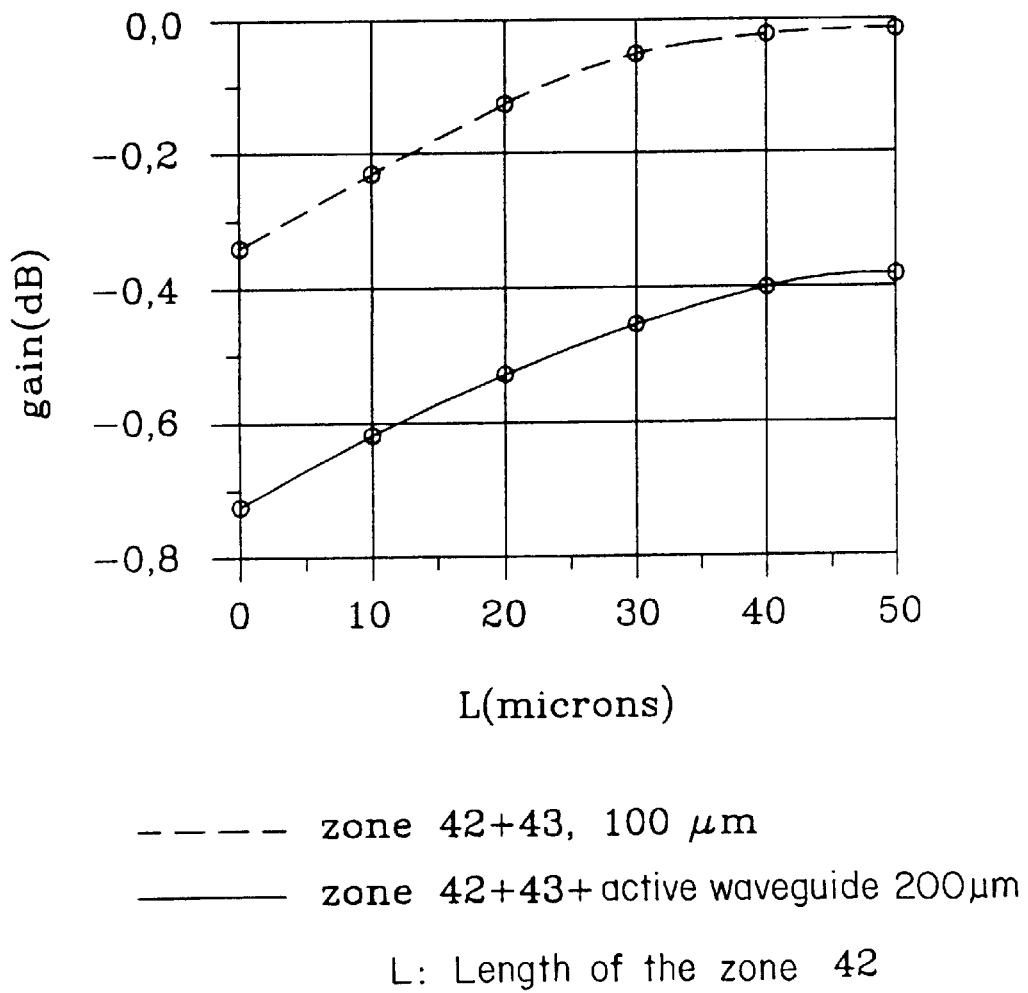
FIG. 3 shows two curves illustrating the propagation losses of a component of the invention respectively with a thin waveguide and without a thin waveguide, and as a function of the length of the reduced-thickness section of the thick waveguide.

The curves in FIG. 3 show the propagation losses in a component of the invention as a function of the length of the graded-thickness section 42, the component comprising, in a first case, a thick waveguide having a thickness gradient (zone 42) and a reduced-thickness section (zone 43) and, in a second case, a thick waveguide having a thickness gradient (zone 42) and a reduced-thickness section (zone 43) coupled to a thin waveguide (52). The optical losses intrinsic to the thickness gradient are less than one dB. They are in general about 0.4 dB when the zone 42 has a length greater than 50 μm, and they therefore remain acceptable.

We claim:

1. A method of manufacturing an integrated optical component comprising a thick waveguide coupled to a thin waveguide via a coupling interface, said method consisting in:

depositing a first guiding layer of said thick waveguide on a substrate;

locally etching said first guiding layer over a portion allocated both to the coupling interface and to the thin waveguide;

depositing a second guiding layer on the first guiding layer and on the locally etched portion so as to form said thick waveguide in a manner such that it has a maximum thickness in a first zone, a graded-thickness section in a second zone, and a reduced-thickness section in a third zone;

locally etching the second guiding layer over a portion of the third zone, said portion being allocated to the thin waveguide; and depositing a third guiding layer in said portion of said third zone so as to form said thin waveguide.

2. A method according to claim 1, wherein, to form the graded-thickness section, two dielectric masks are disposed on the locally-etched portion.

3. A method according to claim 2, wherein the masks are trapezium shaped, and wherein they are placed side-by-side such that the distance between them increases between the first zone, corresponding to the thick section of the waveguide, and the third zone, corresponding to the reduced-thickness section of the waveguide.

4. A method according to claim 2, wherein the masks are formed of silica or of silicon nitride.

5. A method according to claim 1, wherein the first guiding layer is deposited over a thickness lying in the range 0.5 μm to 2.1 μm, the second guiding layer is deposited over a thickness lying in the range 0.5 μm to 0.9 μm, and the third guiding layer is deposited over a thickness lying in the range 0.2 μm to 0.5 μm.

6. A method according to claim 1, wherein the guiding layers are deposited in a manner such that the coupling interface forms an arbitrary angle with the plane of said guiding layers.

* * * * *